United States Patent
Ferran et al.

(10) Patent No.: US 10,641,834 B2
(45) Date of Patent: May 5, 2020

(54) METHOD FOR ESTIMATING A STATE OF ENERGY OF A BATTERY

(71) Applicant: Airbus SAS, Blagnac (FR)

(72) Inventors: Benoit Ferran, Paris (FR); Clément Dinel, Issy-les-Moulineaux (FR)

(73) Assignee: Sirbus SAS, Blagnac (FR)

( * ) Notice: Subject to any disclaimer, the term of this patent is extended or adjusted under 35 U.S.C. 154(b) by 83 days.

(21) Appl. No.: 16/037,392

(22) Filed: Jul. 17, 2018

(65) Prior Publication Data

US 2019/0033379 A1 Jan. 31, 2019

(30) Foreign Application Priority Data

Jul. 27, 2017 (FR) ...................................... 17 57153

(51) Int. Cl.
| | | |
|---|---|---|
| *G01R 31/36* | (2020.01) | |
| *G01R 31/387* | (2019.01) | |
| *G01R 31/367* | (2019.01) | |
| *G01R 31/382* | (2019.01) | |
| *G01R 31/3832* | (2019.01) | |
| *G01R 31/389* | (2019.01) | |
| *G01R 31/392* | (2019.01) | |
| *G01R 31/3835* | (2019.01) | |
| *H01M 10/42* | (2006.01) | |

(52) U.S. Cl.
CPC ......... *G01R 31/387* (2019.01); *G01R 31/367* (2019.01); *G01R 31/382* (2019.01); *G01R 31/389* (2019.01); *G01R 31/3833* (2019.01); *G01R 31/3835* (2019.01); *G01R 31/392* (2019.01); *H01M 10/425* (2013.01); *H01M 2010/4271* (2013.01)

(58) Field of Classification Search
None
See application file for complete search history.

(56) References Cited

U.S. PATENT DOCUMENTS

| | | |
|---|---|---|
| 2013/0038292 A1 | 2/2013 | Barrett et al. |
| 2016/0084910 A1* | 3/2016 | Johnson ............ G01R 31/3648 702/63 |
| 2017/0088072 A1 | 3/2017 | Curtis et al. |

FOREIGN PATENT DOCUMENTS

| | | |
|---|---|---|
| DE | 102015114652 | 3/2016 |
| FR | 2853081 | 10/2004 |
| GB | 2490295 | 10/2012 |

OTHER PUBLICATIONS

French Search Report, dated Apr. 17, 2018, priority document.
"Maximum Available Capacity and Energy Estimation Based on Support Vector Machine Regression for Lithium-ion Battery" Deng. et al., Mar. 9, 2017.

* cited by examiner

*Primary Examiner* — Jas A Sanghera
(74) *Attorney, Agent, or Firm* — Greer, Burns & Crain, Ltd.

(57) ABSTRACT

A method for estimating a state of energy of a battery, comprising the steps of estimating a state of charge of the battery, determining a discrepancy between the state of charge and the state of energy as a function of the state of charge, computing the state of energy as a function of the estimated state of charge and of the determined discrepancy. Also a battery including apparatus configured to implement the method is provided.

15 Claims, 3 Drawing Sheets

METHOD FOR ESTIMATING A STATE OF ENERGY OF A BATTERY

CROSS-REFERENCES TO RELATED APPLICATIONS

This application claims the benefit of the French patent application No. 1757153 filed on Jul. 27, 2017, the entire disclosures of which are incorporated herein by way of reference.

TECHNICAL FIELD

The invention belongs to the field of electrical storage batteries.

More particularly, the invention relates to a method for estimating a state of energy of a battery.

BACKGROUND OF THE INVENTION

It is widespread practice for the batteries of electric or hybrid vehicles HEV (Hybrid Electric Vehicles) to include a management system implementing an estimator of the state of charge SOC of the battery. The management system provides an operator or a driver of the vehicle with an estimation of an electrical charge remaining out of the capacity of the battery, for example presented in the form of operating battery life.

However, the operator or the pilot has more need of information concerning the energy available in the battery rather than information concerning its charge. In this regard, the state of energy SOE reflecting a percentage of energy remaining in the battery, is relevant information.

Currently, there is a limited number of estimators of the state of energy, SOE.

One drawback with some of the existing estimators is that they are limited in their use in as much as they are valid only in limited cases. For example, some estimators are valid only at the start of life because their estimation does not take account of the aging of the battery.

In their scientific publication *A method for state of energy estimation of lithium-ion batteries based on neural network model*, G. Dong et al. describe a method aimed at estimating the state of energy of batteries of lithium-ion type on the basis of a neural network model.

X. Liu et al. also describe, in *A method for state of energy estimation of lithium-ion batteries at dynamic currents and temperatures*, an estimator of the state of energy of neural network type.

One drawback with these estimators is that they are complex to implement.

The international patent application WO2016112960 describes a method for determining the state of energy SOE by integration of the curve of voltage at the terminals of the battery over a given state of charge SOC interval.

The patent application DE 10 2015 114652 A1, the patent application US2017/088072A1, and the scientific publication *Maximum Available Capacity and Energy Estimation Based on Support Vector Machine Regression for Lithium-ion Battery* by Zhongwei Deng et al., describe methods for determining the state of energy SOE of a battery.

SUMMARY OF THE INVENTION

The invention proposes an alternative to the existing state-of-charge estimators. The implementation of the solution of the invention proves simpler to implement compared to the prior art solutions implementing neural networks.

The invention relates to a method for estimating a state of energy SOE of a battery, comprising a step of estimation of a state of charge SOC of the battery, the method being characterized in that it also comprises the following steps of:
- preliminary determination of the trend of a discrepancy $\Delta$ between the state of charge SOC and the state of energy SOE as a function of the state of charge SOC;
- determination of a discrepancy $\Delta$ between the state of charge SOC and the state of energy SOE as a function on the one hand of the state of charge estimated in the estimation step and on the other hand of the trend of the discrepancy $\Delta$ determined in the preliminary determination step;
- computation of the state of energy SOE as a function of the state of charge SOC estimated in the determination step and of the discrepancy $\Delta$ determined in the determination step.

In one implementation:
- the step of preliminary determination of the trend of a discrepancy $\Delta$ between the state of charge SOC and the state of energy SOE as a function of the state of charge SOC corresponds to the production of at least one chart representing a trend of the discrepancy $\Delta$ as a function of the state of charge SOC of the battery;
- the discrepancy $\Delta$ is determined, in the determination step, through at least one chart produced during the preliminary step.

In one implementation, at least one chart is produced experimentally.

In one implementation, at least one chart is produced by simulation.

In one implementation, the discrepancy $\Delta$ depends on at least one of the following parameters of the battery:
- a power at the terminals of the battery;
- a state of health SOH;
- a temperature of the battery.

In one implementation, the determined discrepancy $\Delta$ is a maximum discrepancy $\Delta op,max$ determined over a lifetime of the battery.

In one implementation, the maximum discrepancy $\Delta op, max$ is determined in the worst case conditions of use of the battery.

In one implementation, the method also comprises a step of estimation of the available energy remaining in the battery.

The invention relates also to a battery comprising a battery management system BMS implementing the method according to the invention. The battery according to the invention comprises:
- means for estimating the state of charge SOC of the battery;
- means for determining the discrepancy $\Delta$, and in particular at least one chart of the trend of the discrepancy $\Delta$ as a function of the state of charge;
- means for computing the state of energy SOE of the battery as a function of the estimated state of charge SOC and of the determined discrepancy $\Delta$.

In one embodiment, the means for estimating the state of charge SOC comprise a device out of:
- means for measuring voltage or impedance;
- an estimator of Coulomb counter type;
- an adaptive system implementing a Kalman filter or neural networks.

BRIEF DESCRIPTION OF THE DRAWINGS

The invention will be better understood on reading the following description and on studying the accompanying figures. The latter are presented only as indicative of and nonlimiting on the invention.

DETAILED DESCRIPTION OF THE PREFERRED EMBODIMENTS

Figure 1:
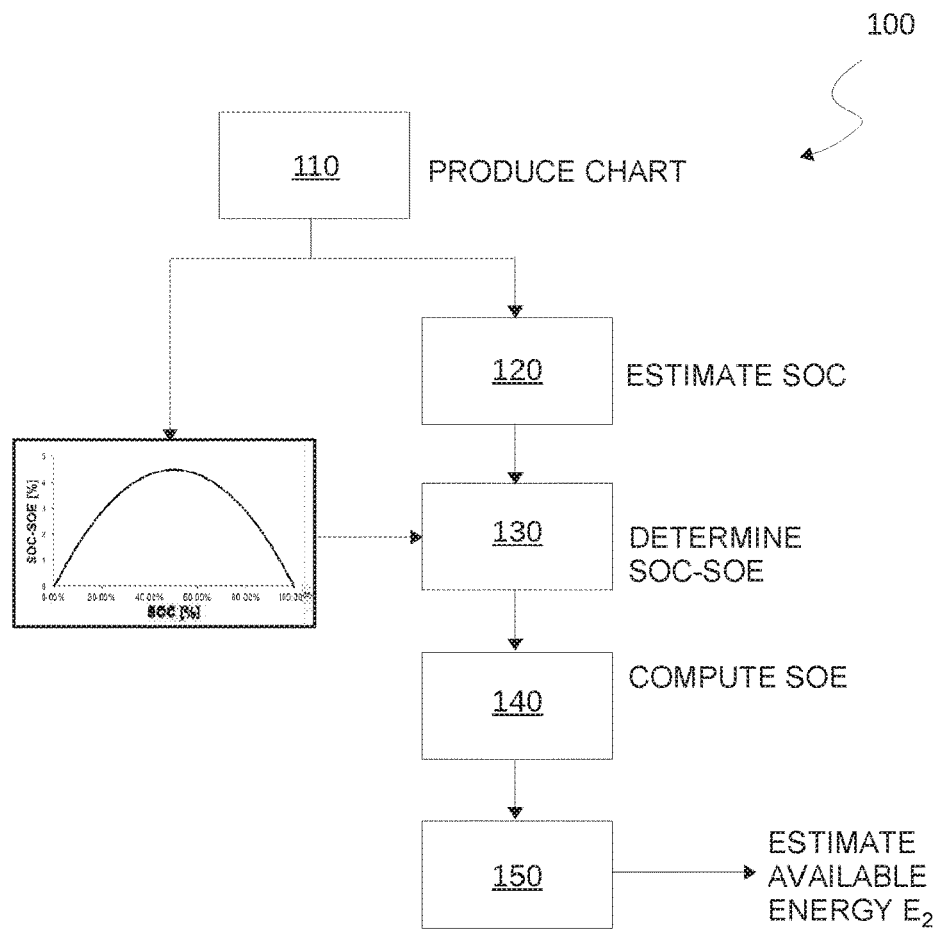
FIG. 1 represents the main steps of the method according to the invention.

Referring to FIG. 1, the invention relates to a method 100 for estimating a state of energy SOE of a battery.

The state of energy SOE, which will be expressed as a percentage, corresponds to the ratio of an energy available in the battery at a given instant t to a maximum energy that the battery is able to store at that instant t.

The method according to the invention comprises the following steps:
- estimation 120 of a state of charge SOC of the battery;
- determination 130 of a discrepancy $\Delta$ quantifying a difference between the state of charge SOC and the state of energy SOE, for the state of charge of the battery estimated in the preceding step;
- computation 140 of the state of energy SOE.

The state of charge SOC, expressed as a percentage, is the ratio of an electrical charge available in the battery at an instant t to a capacity of the battery at that instant, that is to say the maximum electrical charge that it is able to store given, for example, its state of aging.

The state of charge SOC and the state of energy SOE are quantities which depend in particular on the following parameters:
- a power P supplied to the battery (charging case) or delivered by the battery (discharging case);
- a state of health SOH of the battery, taking account of the calendar and cycling agings;
- a temperature T of the battery.

The state of charge SOC and the state of energy SOE are expressed formally as follows:

$$SOC(t_f) = SOC(t_i) + \frac{1}{C(SOH; T; P)} \int_{t_i}^{t_f} I(t)dt \quad (1)$$

$$SOE(t_f) = SOC(t_i) + \frac{1}{E(SOH; T; P)} \int_{t_i}^{t_f} U(t)I(t)dt \quad (2)$$

with:
- $t_i$: instant of start of charge (or of discharge);
- $t_f$: instant of end of charge (or of discharge);
- $I(t)$: current intensity supplied to or delivered by the battery;
- $U(t)$: voltage at the terminals of the battery;
- C: capacity of the battery;
- E: maximum energy of the battery.

The estimation 120 of the state of charge SOC can be performed by any known means, in particular:
- direct measurement (open-circuit voltage method, terminal voltage method, impedance method, etc.);
- estimators;
- adaptive systems.

For example, a Coulomb counter can be put in place. According to the Coulomb counter method, the state of charge SOC is estimated at the instant $n\Delta t$ from a preceding instant $(n-1)\Delta t$ according to the formula:

$$SOC(n) = SOC(n-1) + \frac{i(t)\Delta t}{K}$$

Where K is a constant.

The British patent GB 2490295 describes a method for managing the charge of a battery using a Coulomb counter.

An adaptive system of neural network or Kalman filter type can also be put in place. The French patent FR 2853081 describes a method for determining an instantaneous state of charge of a battery implementing a Kalman filter.

The state of charge SOC estimated in this step is hereinafter denoted $SOC_{op}$.

Once the state of charge $SOC_{op}$ is estimated, for example by one of the means described above, the discrepancy $\Delta$, for this state of charge $SOC_{op}$, is determined 130.

The discrepancy $\Delta$ is defined generally by the relationship:

$$\Delta = SOC - SOE$$

In one implementation of the invention, the trend of the discrepancy $\Delta$ as a function of the state of charge SOC is deduced from charts produced experimentally.

The experimental production of the charts is done as follows: tests are performed on a discharge cell at constant power, at different states of health SOH, different cell temperatures and different discharge powers. The parameters recorded are at least: current, voltage, power, capacity, energy, temperature. When the test is finished, the maximum discharged capacity is computed and the trend of the state of charge SOC during discharge (capacity discharged at any instant/maximum capacity) is thus obtained. Likewise, the maximum discharged energy is computed and the trend of the state of energy SOE during discharge (energy discharged at any instant/maximum energy) is thus obtained.

It is then possible to plot different charts of $\Delta$ for different SOH, cell temperatures, discharge power.

Figure 2:
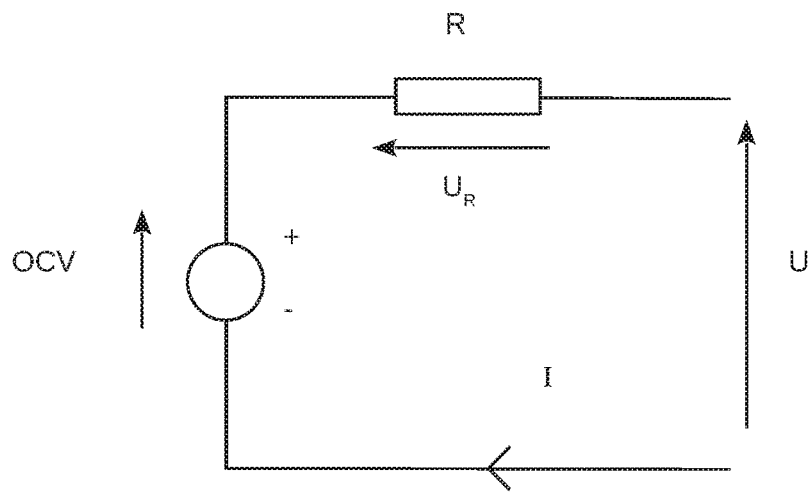
FIG. 2 represents an electrical model of a battery.

In an alternative implementation, the discrepancy $\Delta$ is simulated digitally. Referring to FIG. 2, the battery can be modelled by an open circuit voltage source OCV connected to an internal resistance R placed in series (Rint model). The internal resistance, associated with losses by Joule effect, increases over the lifetime of the battery. According to this model, and according to the conventions adopted in FIG. 2, the voltage U at the terminals of the battery is equal to:

$$U(t) = OCV(t) - RI(t)$$

The state of energy SOE can be rewritten, from the equation (2):

$$SOE(t_f) = \quad (3)$$

-continued $$SOE(t_i) + \frac{1}{E(SOH; T; P)}\left(\int_{t_i}^{tf} OCV(t)I(t)dt - \int_{t_i}^{tf} R(t)I^2(t)dt\right)$$

This equation (3) reveals that a discrepancy between the state of charge SOC and the state of energy SOE is attributable to:
- the open circuit voltage OCV;
- the power dissipated by Joule effect because of the internal resistance R.

In this form of implementation, the discrepancy $\Delta$ between the state of charge SOC and the state of energy SOE is simulated on the basis of this equation, by relying for example on mappings of the open circuit voltage OCV and R as a function of the temperature of the battery and of the state of health SOH.

Advantageously, one or more digitally simulated charts can be used in addition to one or more experimental charts to consolidate the experimental results.

Generally, it should be noted that the discrepancy $\Delta$ depends on:
- a power at the terminals of the battery;
- the state of health SOH of the battery;
- the temperature of the battery.

In all cases, the charts are produced beforehand, in a step of production 110 of at least one chart in implementing the invention.

In one implementation, the current at the terminals of the battery is taken into account in producing the charts. This mode of implementation is particularly suited to an implementation of the method in hybrid systems, in which the battery is made to undergo significant current variations at its terminals.

Figure 3:
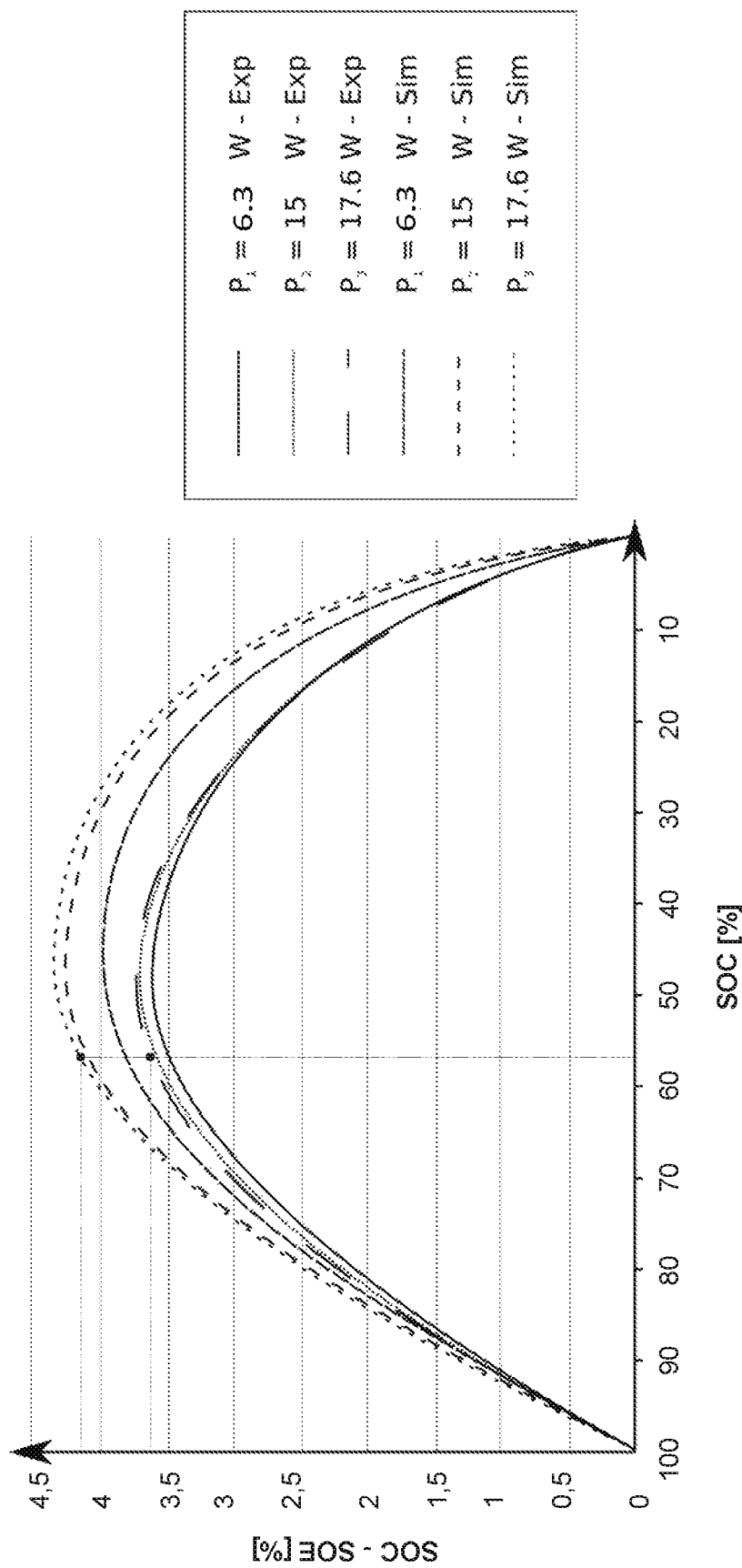
FIG. 3 represents a trend, for a given battery, of the discrepancy between the state of charge and the state of energy as a function of the state of charge, of the discharge power at the terminals of the battery, and of the mode of determination by experimentation or by simulation.

FIG. 3 illustrates an example of charts giving the discrepancy $\Delta$ as a function of the state of charge SOC. These charts were produced in the following conditions:
- battery discharge phase: for three different discharge powers:
  P1=6.3 W;
  P1=15 W;
  P1=17.6 W;
- at the start of life of the battery (SOH≥98%);
- battery temperature T of 23° C.;

The discharge powers of interest $P_1$, P2 and P3 correspond to orders of magnitude typically encountered in the field of aeronautics, for levelling-off, continuous climb and initial climb phases respectively.

The charts are produced experimentally on the one hand and by simulation on the other hand The name of the curves produced experimentally appears in the key to FIG. 3 with the suffix "—Exp". The name of the curves produced by simulation appears in the key to this figure with the suffix "—Sim".

It emerges that the discrepancy $\Delta$ obtained increases with the discharge power. Generally, the discrepancy $\Delta$ increases with:
- the charge or discharge power at the terminals of the battery;
- the internal resistance dissipating the power by Joule effect, which internal resistance increases with:
  - the age of the battery;
  - a reduction in the battery temperature.

The determination 130 of the discrepancy $\Delta$ is done through the charts produced experimentally or by simulation. $\Delta_{op}$ denotes the recorded discrepancy corresponding to the state of charge $SOC_{op}$.

Next, the state of energy SOE is computed 140. The state of energy $SOE_{op}$ corresponding to the state of charge $SOC_{op}$ is computed according to the following relationship:

$$SOE_{op}=SOC_{op}-\Delta_{op}$$

Referring to FIG. 3, for a state of charge $SOC_{op}$ of 57% and a discharge power of 17.6 W, the maximum discrepancy $\Delta_{op}$,exp, based on the experimental results, is equal to 4.15%. The associated state of energy $SOE_{op}$,exp is equal to:

$$SOE_{op,exp}=SOC_{op}-\Delta_{op,exp}=52.85\%$$

Similarly, for a state of charge $SOC_{op}$ of 57% and a discharge power of 17.6W, the maximum discrepancy $\Delta_{op}$, sim, based on the simulation results, is equal to 3.65%. The associated state of energy $SOE_{op}$,sim is equal to:

$$SOE_{op,sim}=SOC_{op}-\Delta_{op,sim}=53.35\%$$

The charts of FIG. 3 are valid for a given state of health SOH of the battery. In order to prevent an excessive overestimation of the state of energy SOE, in one implementation of the method according to the invention, a discrepancy $\Delta_{op}$,max is assumed that is independent of the state of health SOH, for a given state of charge $SOC_{op}$, and equal to the maximum of the discrepancies observed at this state of charge throughout the lifetime of the battery. In an alternative implementation, this discrepancy is also taken to be independent of the power at the terminals of the battery and of its temperature. The discrepancy is then determined in the worst case conditions.

As an example, if a chart indicates that the maximum discrepancy $\Delta_{op}$ is 4.5%, whatever the age of the battery, the power at its terminals and its temperature, and assuming a state of charge $SOC_{op}$ of 57%, the state of energy $SOE_{op}$ is equal to 52.5% over the lifetime of the battery for this state of charge.

Referring to FIG. 3, it should be noted that the discrepancy $\Delta$ is close to zero at the start of discharge and at the end of discharge of the battery, and maximum for a state of charge SOC of approximately 45%.

Consequently, it is possible to estimate 150 the energy available in the battery.

Figure 4:
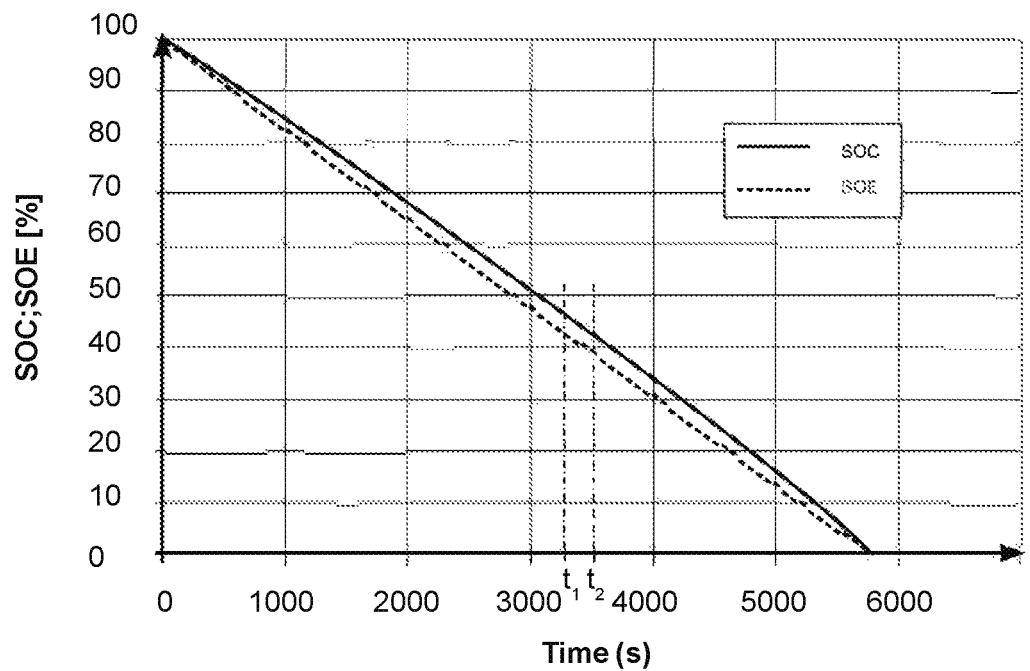
FIG. 4 represents the trends over time of the state of charge and of the state of energy for the battery of FIG. 3, for a given power.

FIG. 4 illustrates the profiles of estimated state of charge $SOC_{op}$ and state of energy $SOE_{op}$, as a function of time, for a power at the terminals of the battery equal to P1, i.e. 6.3 W, in a discharge phase.

A time interval [t1;t2] is considered over which the state of energy SOE has been estimated, as described above, for example:

$$t_1=3392s$$

$$t_2=3422s$$

The power delivered by the battery is considered to be constant over this time interval. Consequently, the state of energy SOE decreases linearly over the time interval.

By linear extrapolation, it is possible to estimate the instant td at which the state of energy SOE will be nil, which corresponds to a total discharge of the battery. In the example of FIG. 4, the following is obtained:

$$t_d=5787s$$

An estimation is deduced therefrom of the remaining energy E2 at the instant t2 in the battery:

$$E_2=P_1(t_d-t_2)$$

Where P1 is the power delivered by the battery and $t_d-t_2$ is the remaining time estimated by linear extrapolation before total discharge of the battery.

In the example of FIG. 4, the following is deduced therefrom:

$$E_2 = 4.1 Wh$$

It should be noted that, while the exemplary implementation of FIGS. 3 and 4 illustrates a discharge phase of a battery, the method according to the invention applies, mutatis mutandis, to a charge phase of the battery.

Figure 5:
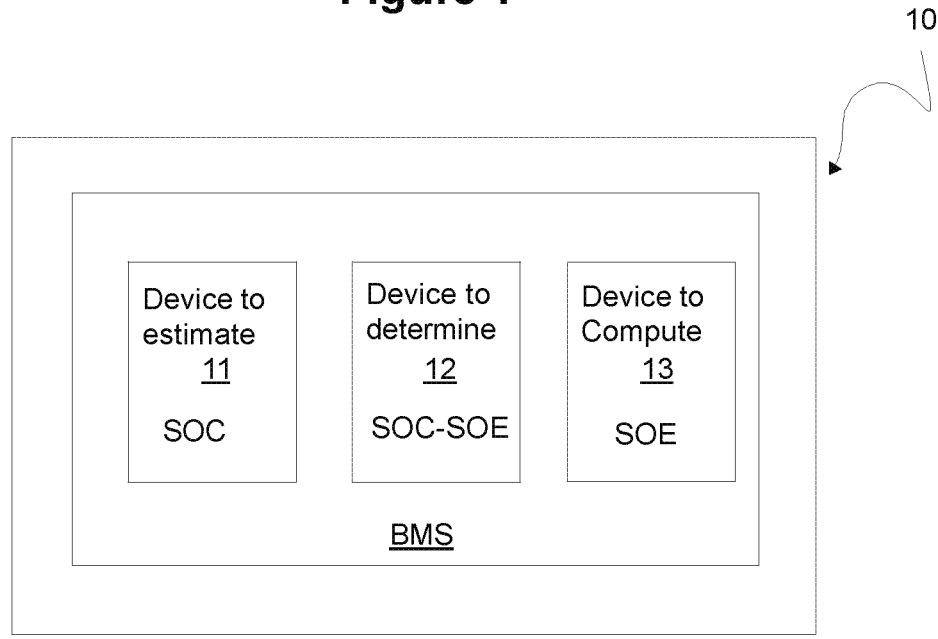
FIG. 5 schematically represents a battery according to the invention.

As shown in FIG. 5, the invention relates also to a battery 10 comprising a battery management system BMS implementing the method according to the invention.

The battery management system BMS according to the invention comprises a device configured to:
- estimate 11 the state of charge SOC of the battery;
- determine 12 the discrepancy Δ, and in particular a device configured to use and possibly store at least one chart of the trend of the discrepancy Δ as a function of the state of charge;
- compute 13 the state of energy SOE of the battery.

The device 11 to estimate the state of charge SOC can, for example, be:
- a device configured to measure voltage or impedance;
- an estimator of Coulomb counter type;
- an adaptive system implementing, for example, a Kalman filter or neural networks.

The invention makes it possible to indicate to an operator an estimated level or percentage of energy available in a battery at a given instant. The invention is simple to implement in as much as:
- it is based on estimators of the state of charge SOC conventionally used to estimate the state of charge SOC of the battery;
- the number of experimental tests is limited by comparison to the existing state-of-energy estimators;
- there is no need to estimate the voltage drop at the terminals of the battery, for example by estimating the impedance of the battery, because the knowledge thereof is not necessary to the implementation of the invention.

Moreover, the invention takes account of the aging of the battery since the discrepancy Δ depends on the state of health of the battery.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for estimating a state of energy of a battery, comprising:
    estimating a state of charge of the battery;
    preliminarily determining a trend of a discrepancy between the state of charge and the state of energy as a function of the state of charge;
    determining a discrepancy between the state of charge and the state of energy as a function of the state of charge estimated in the estimating step and of the trend of the discrepancy determined in the preliminary determining step; and,
    computing the state of energy as a function of the state of charge estimated in the estimating step and of the discrepancy determined in the determining step.

2. The method according to claim 1, wherein:
    the step of preliminarily determining the trend of a discrepancy between the state of charge and the state of energy as a function of the state of charge corresponds to a production of at least one chart representing a trend of the discrepancy as a function of the state of charge of the battery; and
    the discrepancy is determined in the determining step through at least one chart produced during said preliminary step.

3. The method according to claim 2, wherein at least one chart is produced experimentally.

4. The method according to claim 2, wherein at least one chart is produced by simulation.

5. The method according to claim 1, wherein the discrepancy depends on at least one parameter of the battery selected from the group of:
    a power at terminals of said battery;
    a state of health of said battery;
    a temperature of said battery.

6. The method according to claim 5, wherein the determined discrepancy is a maximum discrepancy determined over a lifetime of the battery.

7. The method according to claim 1, further comprising estimating an available energy remaining in the battery.

8. A battery comprising a battery management system configured to implement the method according to claim 1, wherein said management system comprises:
    a device configured to estimate the state of charge of the battery;
    a device configured to determine the discrepancy, and at least one chart of the trend of the discrepancy as a function of the state of charge;
    a device configured to determine the state of energy of the battery as a function of the estimated state of charge and of the determined discrepancy.

9. The battery according to claim 8, wherein the device for estimating the state of charge comprise at least one of:
    a device configured to measure voltage or impedance;
    an estimator of Coulomb counter type;
    an adaptive system implementing a Kalman filter or neural networks.

10. The method according to claim 1, wherein the estimation of the state of charge is performed by at least one of the following:
    direct measurement;
    estimators; and
    adaptive systems.

11. A method for estimating a state of energy of a battery, comprising:
    estimating a state of charge of the battery;
    preliminarily determining a trend of a discrepancy between the state of charge and the state of energy as a function of the state of charge, the preliminary determination corresponding to a production of at least one chart representing the trend of the discrepancy as a function of the state of charge of the battery;
    determining a discrepancy between the state of charge and the state of energy as a function of both the state of charge estimated in the estimating step and the trend of the discrepancy determined in the preliminary determining step, the discrepancy being determined through the at least one chart produced during the preliminary determination step;

computing the state of energy as a function of the state of charge estimated in the estimating step and of the discrepancy determined in the determining step; and estimating an available energy remaining in the battery.

12. The method according to claim 11, wherein the discrepancy depends on at least one parameter of the battery selected from the group of:

a power at terminals of said battery;

a state of health of said battery;

a temperature of said battery.

13. The method according to claim 11, wherein at least one chart is produced experimentally.

14. The method according to claim 11, wherein at least one chart is produced by simulation.

15. The method according to claim 11, wherein the determined discrepancy is a maximum discrepancy determined over a lifetime of the battery.

* * * * *